United States Patent [19]
Leonard et al.

[11] Patent Number: 5,959,842
[45] Date of Patent: Sep. 28, 1999

[54] SURFACE MOUNT POWER SUPPLY PACKAGE AND METHOD OF MANUFACTURE THEREOF

[75] Inventors: Scott E. Leonard, Rockwall; Yi Teh Shih, Richardson; William L. Woods, Jr., Kaufman, all of Tex.

[73] Assignee: Lucent Technologies Inc., Murray Hill, N.J.

[21] Appl. No.: 09/078,791

[22] Filed: May 14, 1998

[51] Int. Cl.[6] .............................. H05K 7/14; H05K 7/12
[52] U.S. Cl. .......................... 361/752; 361/736; 361/747; 361/757; 361/767; 361/771; 361/813; 174/52.2; 264/272.11
[58] Field of Search .................................... 361/601, 622, 361/623–625, 679, 683, 728, 736, 740, 746, 747, 752, 757, 759, 760, 767, 771, 782, 783, 807, 809, 812, 813, 829, 836; 174/50.51, 52.1, 52.2, 260; 29/827, 831, 841; 307/64–66, 147; 264/272.11

[56] References Cited

U.S. PATENT DOCUMENTS

| | | | |
|---|---|---|---|
| D. 357,901 | 5/1995 | Hörman | D13/182 |
| 4,645,943 | 2/1987 | Smith, Jr. et al. | 307/66 |
| 4,899,256 | 2/1990 | Sway-Tin | 361/752 |
| 5,526,234 | 6/1996 | Vinciarelli et al. | 361/740 |
| 5,703,754 | 12/1997 | Hinze | 174/52.2 |
| 5,757,251 | 5/1998 | Hashinaga et al. | 361/752 |
| 5,835,350 | 11/1998 | Stevens | 361/752 |

*Primary Examiner*—Leo P. Picard
*Assistant Examiner*—John B. Vigushin

[57] ABSTRACT

A surface mount package for containing a board-mounted power supply, a method of manufacturing the same and a board-mounted power supply employing the package. In one embodiment, the package includes: (1) a plurality of leads having first ends and second, surface mount ends, (2) a dielectric lead frame that retains the plurality of leads in predetermined positions relative to one another such that at least some of the second, surface mount ends are co-planar, the first ends couplable to the board-mounted power supply, (3) a shell, coupled to the lead frame, that forms a portion of a periphery of the surface mount package and (4) potting material located between the lead frame and the shell.

21 Claims, 4 Drawing Sheets

SURFACE MOUNT POWER SUPPLY PACKAGE AND METHOD OF MANUFACTURE THEREOF

TECHNICAL FIELD OF THE INVENTION

The present invention is directed, in general, to electronic component packaging and, more specifically, to a surface mount power supply package and a method of manufacturing the same.

BACKGROUND OF THE INVENTION

Electronic devices for power supplies or other applications are conventionally provided in a protective, heat-dissipating package. Often, the device (e.g., a metal oxide semiconductor field-effect transistor, or "MOSFET") is attached to a lead-frame by a wire bonding technique. The device is then encapsulated or "molded," wherein an encapsulant is formed about the device to yield a unitary, board-mountable package device. One well-known configuration for board-mountable package is a so-called dual in-line package ("DIP"), wherein electrical leads protrude from opposing sidewalls of the package. The leads are advantageously so arranged to allow the package to be mounted to a circuit board by various conventional soldering processes. DIPs are widely used for packaging integrated circuits, most often in telecommunications or computer-related environments.

In a power electronics environment, the packaged power devices are conventionally mounted directly to a circuit board, using either through-hole or surface-mounting techniques. The devices are then joined with other electronic components to form a circuit, perhaps to function as a power supply such as a DC/DC power converter.

As with other types of electronic components, the trend in the design of power supplies has been toward achieving increased power and device density and lower device profile. However, any improvements in power, density and profile cannot be at the expense of the thermal and electrical characteristics of the components and overall power supply.

Typical power supply assembling techniques commonly include soldering necessary components to a printed wire board (PWB). Necessary components vary from application to application, but usually include power components (commonly a magnetic core) and associated control circuitry. The PWB and components are then encapsulated for mechanical protection and thermal management.

Due to design and market demands, power supplies are now customarily configured to be surface mountable. Problems resulting from such designs include lead coplanarity. Once the supply is finished and reflow soldered, the leads extending from the package need to remain coplanar to ensure proper contact with a larger circuit board.

Further, after the supply is soldered, the package is potted, placing unnecessary stresses upon the components and enclosure as a whole. Once soldered, typical practices include overmolding the entire supply package to further secure the leads. This practice commonly places stresses upon the components and the package as a whole which can cause a number of problems, including, but not limited to magnetostriction. Magnetostriction occurs when power magnetic components suffer compressive stresses during encapsulation. The stresses cause the magnetic properties of the components to degrade to such a point as to be relatively useless.

Another problems encountered involves the solder used in the package during assembly. When the finished package is reflow soldered to a board, the resulting heat commonly causes failures in the earlier soldered components, resulting in failures and reliability problems.

Finally, another problems associated with common assembly techniques centers around the highly manual nature of the process. Numerous labor-filled hours are wasted by hand assembling power supply packages when any type of automation could save abundant amounts of money.

Accordingly, what is needed in the art is a surface mounted power supply that is capable of being fabricated in an automated process while retaining coplanarity and electrical reliability.

SUMMARY OF THE INVENTION

To address the above-discussed deficiencies of the prior art, the present invention provides a surface mount package for containing a board-mounted power supply, a method of manufacturing the same and a board-mounted power supply employing the package. In one embodiment, the package includes: (1) a plurality of leads having first ends and second, surface mount ends, (2) a dielectric lead frame that retains the plurality of leads in predetermined positions relative to one another such that at least some of the second, surface mount ends are co-planar, the first ends couplable to the board-mounted power supply, (3) a shell, coupled to the lead frame, that forms a portion of a periphery of the surface mount package and (4) potting material located between the lead frame and the shell and adapted to resist movement of the board-mounted power supply within the surface-mount package. Besides resisting movement, the potting material may aid in conducting thermal energy from the power supply to an environment surrounding the package.

The present invention therefore introduces a package for a power supply in which a dielectric lead frame provides structural integrity and a desired degree of lead coplanarity.

In one embodiment of the present invention, the first ends are through-hole mount ends adapted to pass through corresponding vias in the board-mounted power supply. Alternatively, the first ends may be surface mount ends adapted to be surface mounted to a circuit board of the board-mounted power supply. In another embodiment, the power supply is not board-mounted, but nonetheless is electrically coupled to at least some of the plurality of leads.

In one embodiment of the present invention, the lead frame has a potting port that allows the potting material to be introduced between the lead frame and the shell. The potting port, while not necessary to the present invention, may occupy a significant portion of the total area of the lead frame. Further a pick-and-place bridge may temporarily occupy a portion of the potting port during manufacture of the package to allow the lead frame to be moved by way of conventional pick-and-place equipment.

In one embodiment of the present invention, the lead frame has a retention clip that engages and mechanically retains the board-mounted power supply in contact with the first ends. In a related embodiment, the shell has a retention clip that engages and mechanically retains the lead frame in contact with the shell. Neither of the retention clips is necessary to the present invention, however.

In one embodiment of the present invention, the board-mounted power supply has a magnetic core associated therewith, the package further comprising a compliant material, proximate the magnetic core, that absorbs compressive forces generated in the potting material. This advantageously reduces magnetostriction. Further, the potting material can be cured at a relatively high temperature (to be described in greater detail below) to minimize compression due to thermal expansion.

In one embodiment of the present invention, the lead frame and the shell are composed of plastic. The plastic may be a thermosetting phenolic. Other materials are, of course, fully within the broad scope of the present invention.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
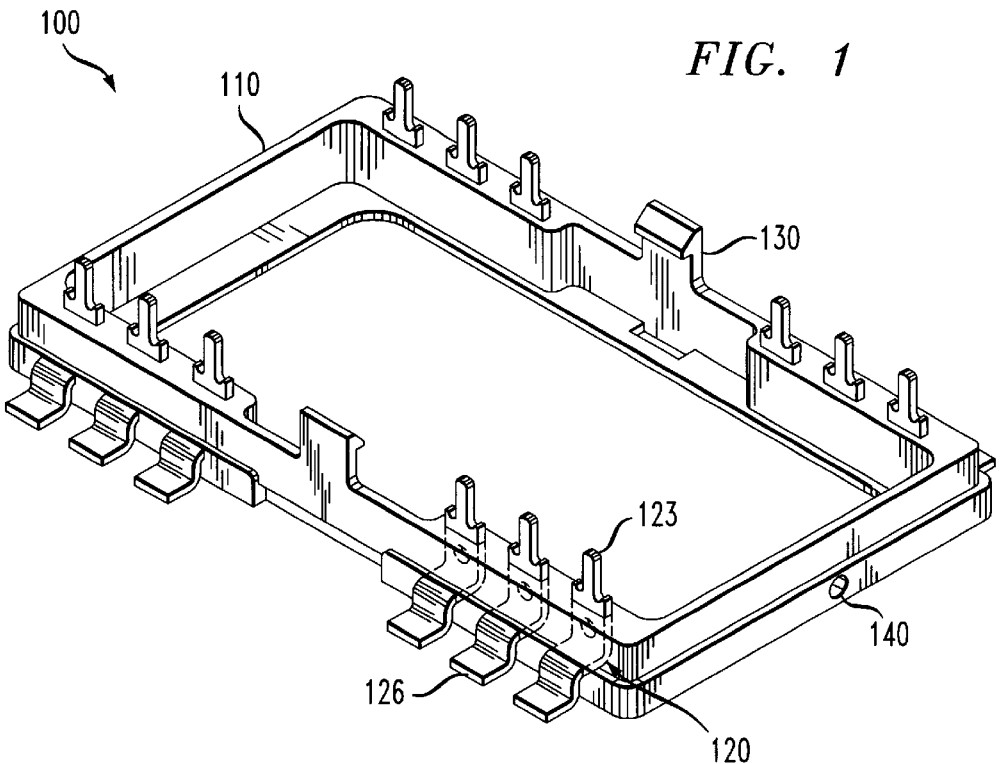
FIG. 1 illustrates an isometric view of an embodiment of a lead frame for a surface mount package constructed according to the principle of the present invention.

Referring initially to FIG. 1, illustrated is an isometric view of an embodiment of a lead frame for a surface mount package constructed according to the principle of the present invention. The lead frame 100 consists of a frame 110 that retains a plurality of leads (one of which designated 120). The leads 120 have first ends 123 that are through-hole mount ends, configured to pass through corresponding openings in a board-mounted power supply and second ends 126 configured for surface mounting. Furthermore, the leads 120 are positioned in the frame 110 so a majority of the second ends are co-planar.

Two retention clips (one of which designated 130) extend from the frame 100 to engage and mechanically retain the board-mounted power supply while in contact with the first ends 123 of the leads 120. Lastly, the frame 110 has a potting port 140 that allows potting material to be introduced between the frame 110 and a shell (later illustrated and described) covering the first ends 123 of the leads 120 and the board-mounted power supply.

Figure 2:
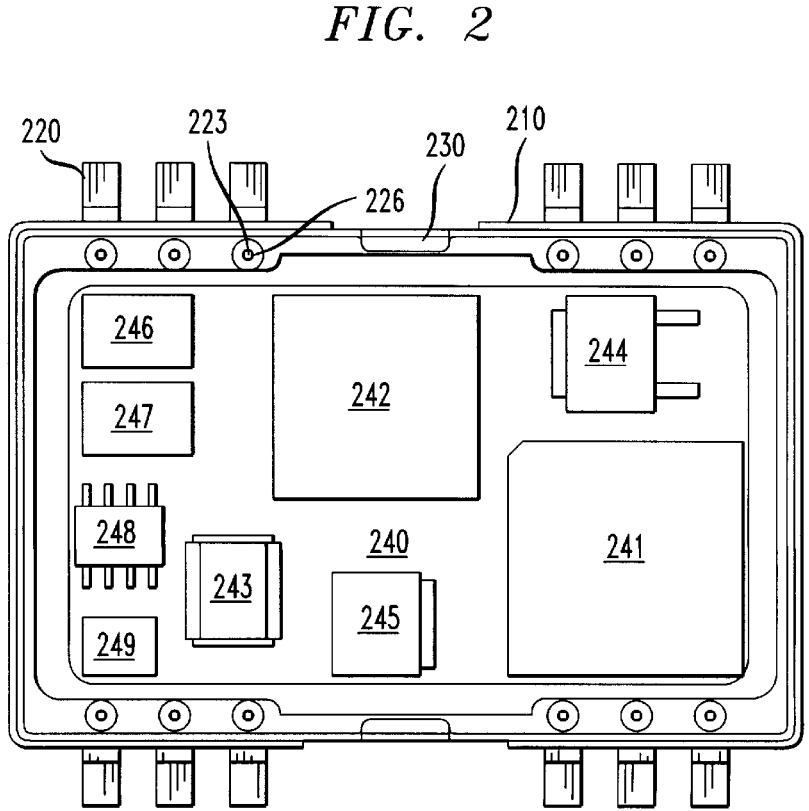
FIG. 2 illustrates a bottom view of an embodiment of a power supply constructed according to the principle of the present invention.

Turning now to FIG. 2, illustrated is a bottom view of an embodiment of a power supply 240 constructed according to the principle of the present invention. This view shows a board-mounted power supply 240 positioned on top of a lead frame 210, where it is engaged and retained by retention clips (one of which designated 230) so that the power supply 240 remains in contact with through-hole ends of a plurality of leads (one of which designated 220). The through-hole ends (one of which is designated 223) are adapted to pass through corresponding vias (one of which is designated 226) in the board-mounted power supply 240.

The power supply 240 contains numerous conventional power and control components. The primary components of the power supply 240 include a transformer 241, first and second inductors 242, first and second field-effect transistors 244, 245, and first and second capacitors 246, 247. Finally, a resistor 248 and a control IC 249 complete this conventional board-mounted power supply 240.

Figure 3:
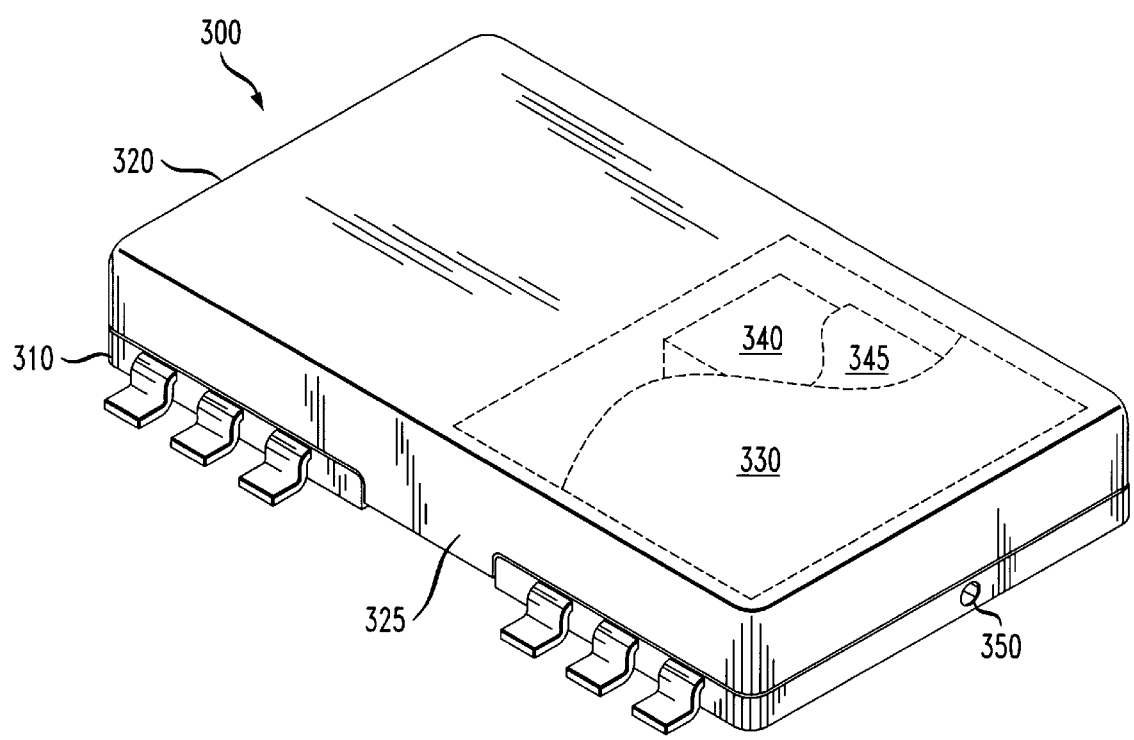
FIG. 3 illustrates an isometric view of an embodiment of a surface mount package constructed according to the principle of the present invention.

Turning now to FIG. 3, illustrated is an isometric view of an embodiment of a surface mount package 300 constructed according to the principle of the present invention. The surface mount package 300 includes a five-sided shell 320 and a lead frame 310, engaged and mechanically retained by retention clips (one of which designated 325) on the shell 320. In a preferred embodiment, the frame 310 and the shell 320 are composed of plastic. A magnetic core 340, associated with a board-mounted power supply, is located within the surface mount package 300 and is substantially surrounded by a compliant material 345 that absorbs compressive forces generated during fabrication of the final product. The magnetic core 340, along with other components of the power supply, is encased in potting material 330 that is introduced between the frame 310 and the shell 320 to provide thermal dissipation for and to resist movement of the magnetic core 340 and other components within the package 300. The potting material 330 is introduced into the package 300 via a potting port 350 located on the frame 310.

Figure 4A:
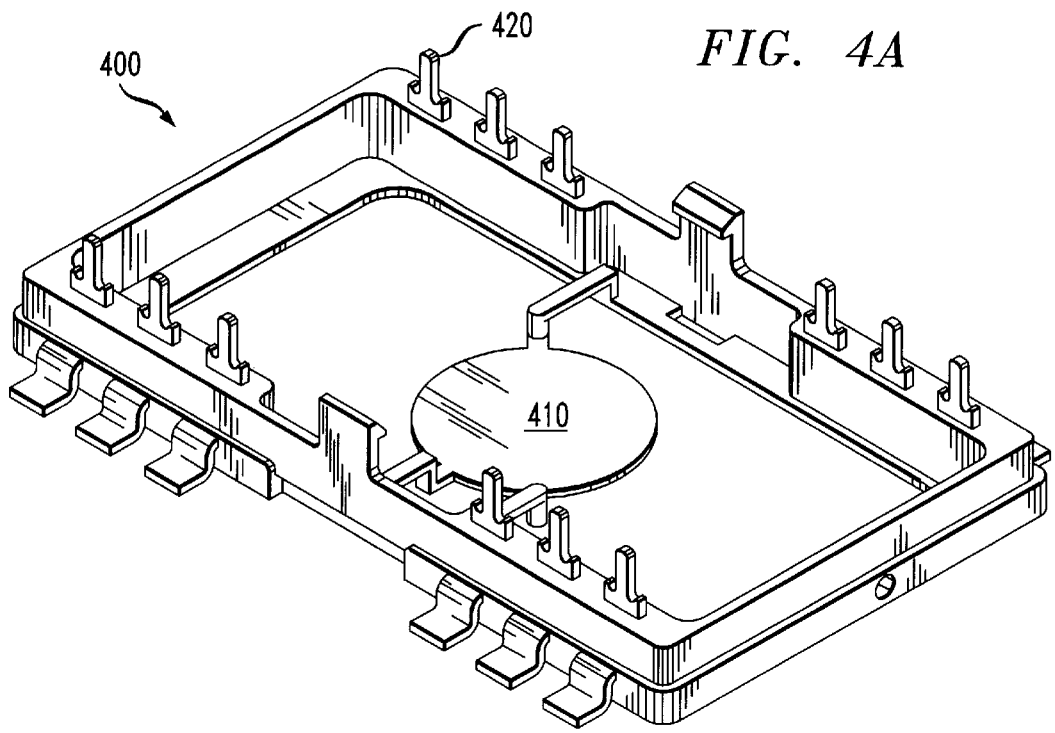
FIGS. 4A–4B illustrate top and bottom views of an embodiment of a lead frame for a surface mount package constructed according to the principle of the present invention.
Figure 4B:
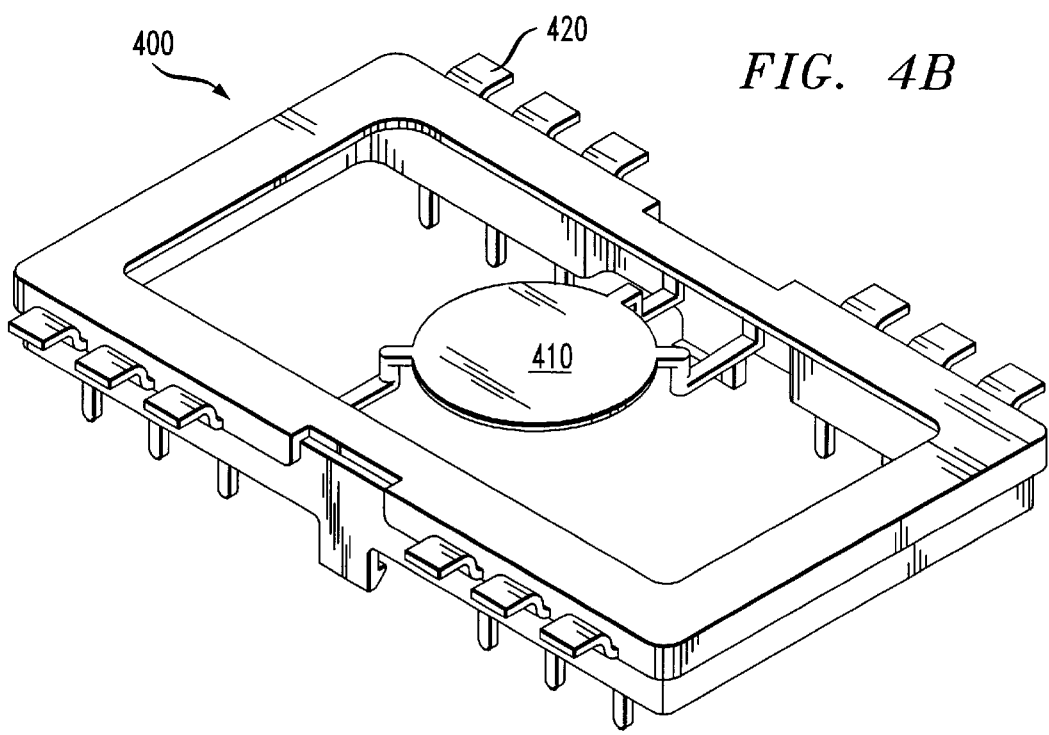

Turning now to FIGS. 4A–4B, illustrated are top and bottom views of an embodiment of a lead frame 400 for a surface mount package constructed according to the principles of the present invention. FIG. 4A shows a lead frame 400 that retains a plurality of leads (one of which designated 420). Additionally, the frame 400 contains a bridge 410 that assists during the mass production of the surface mount packages. The bridge is used during conventional "pick-and-place" assembly of modules. FIG. 4B further shows, from the bottom, how the bridge 410 extends below the frame 400, allowing automated machinery to "pick-and-place" the frame during construction. Once the assembly machinery places the frame 400 in a desired position, the bridge 410 is removed to allow the leads 420 to make their desired contact.

Figure 5:
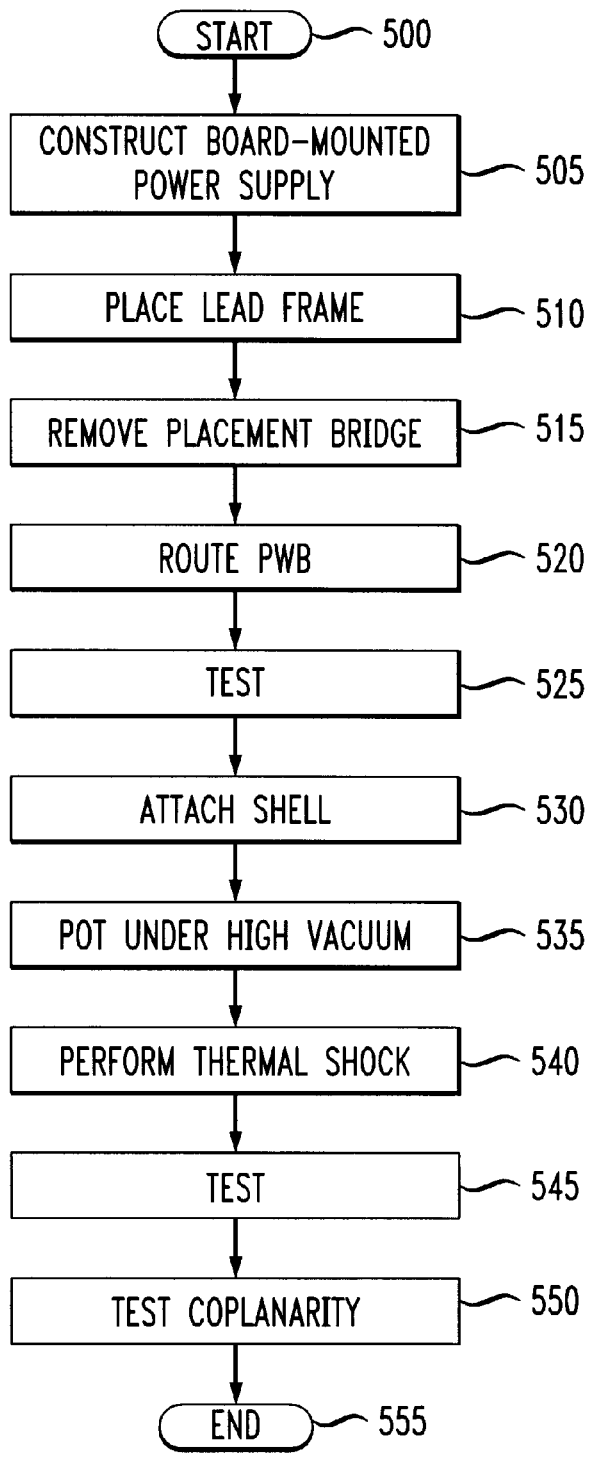
FIG. 5 illustrates a flow diagram of an embodiment of a method of manufacturing a surface mount package according to the principle of the present invention.

Turning now to FIG. 5, illustrated is a flow diagram of an embodiment of a method of manufacturing a surface mount package according to the principle of the present invention. The method begins at a start step 500. During a construct board-mounted power supply step 505, a board mounted power supply usable with an embodiment of the present invention is constructed. The power supply may either be single or double sided and should be configured to accept through hole connectors. Construction commonly involves screen printing one side of a printed wire board (PWB), placing and securing necessary components by high temperature reflow soldering and then repeating the process on the second side of the PWB. In an advantageous embodiment, the reflow temperature is about 240° C.

After constructing the power supply, a lead frame, containing a plurality of leads, is placed on the power supply using an automated "pick-and-place" process during a place lead frame step 510. Prior to the lead frame step 510, the plurality of leads are formed having first ends and second ends and the lead frame, then, retains the plurality of leads in predetermined positions relative to one another such that the leads and the first and second ends may perform the necessary functions. The frame (via first ends of the plurality of leads) and the power supply, connected in a through-hole configuration, are secured by retention clips located on the lead frame and are further secured by reflow at a high temperature. The reflow process also facilitates proper electrical communication between the power supply and the leads retained within the lead frame. In a preferred embodiment, as in the construction step 505, the reflow temperature is about 240° C. Commonly, after fabrication, the finished package is reflow soldered to another board by a purchaser at a temperature of about 220° C. Therefore, the reflowed joints within the package are formed at higher than normal temperatures since they must withstand the later reflowing by the purchaser.

Once the reflow is complete, a placement bridge used during "pick-and-place" assembly is removed from the lead frame in a remove placement bridge step 515. In the past, lead frame placement was typically performed by hand rather than by an automated process. Following the bridge removal, the individual PWB is routed from the panel used while in construction during a route PWB step 520. This portion of the process is also commonly referred to as the singulation of the individual product.

At a first test step 525, the partially constructed, though electrically complete, package is tested for electrical functionality on specified performance. After testing, a shell is secured to the power supply/lead frame assembly by retention clips located on the sides of the shell in a attach shell step 530. Once attached, the package forms a box (5 sides and a rim) that is suitable for potting the interior components with a compliant material, if necessary, and for encapsulation and thermal sinking. Consequently, in a pot under high vacuum step 535, potting material is injected into the package via a potting port, for instance. In an advantageous embodiment, the potting will occur in a high vacuum environment (approximately 29 inches at about 150° C.), thereby evaporating any residues of the soldering .

When potting is complete, the package is subjected to a thermal shock during a perform thermal shock step 540. In a preferred embodiment, the temperatures for the thermal shock range from about −40° C. to about 125° C.

At a second test step 545, the package is again electrically tested at normal operating temperature following the thermal shock. In an advantageous embodiment, this final functional test is conducted at approximately 85° C.

The second ends (i.e., the surface mount ends) of the lead frame still remain exposed. Following the thermal testing, the exposed ends of the leads are tested to insure coplanarity in a test coplanarity step 550. The method, then, concludes at an end step 555.

For a better understanding of power electronics including power supplies and conversion technologies see "Principles of Power Electronics," by J. G. Kassakian, M. F. Schlecht and G. C. Verghese, Addison-Wesley (1991). For a better understanding of magnetic devices and construction techniques therefor see "Handbook of Transformer Applications," by William Flanagan, McGraw Hill Book Co. (1986). The aforementioned references are incorporated herein by reference.

Although the present invention has been described in detail, those skilled in the art should understand that they can make various changes, substitutions and alterations herein without departing from the spirit and scope of the invention in its broadest form.

What is claimed is:

1. A surface mount package for containing a board-mounted power supply, comprising:
    a plurality of leads having first ends and second, surface mount ends;
    a dielectric lead frame that retains said plurality of leads in predetermined positions relative to one another such that at least some of said second, surface mount ends are co-planar, said first ends couplable to said board-mounted power supply;
    a shell, coupled to said lead frame, that forms a portion of a periphery of said surface mount package; and
    potting material located between said lead frame and said shell and adapted to resist movement of said board-mounted power supply within said surface-mount package.

2. The package as recited in claim 1 wherein said first ends are through-hole mount ends adapted to pass through corresponding vias in said board-mounted power supply.

3. The package as recited in claim 1 wherein said lead frame has a potting port that allows said potting material to be introduced between said lead frame and said shell.

4. The package as recited in claim 1 wherein said lead frame has a retention clip that engages and mechanically retains said board-mounted power supply in contact with said first ends.

5. The package as recited in claim 1 wherein said board-mounted power supply has a magnetic core associated therewith, said package further comprising a compliant material, proximate said magnetic core, that absorbs compressive forces generated in said potting material.

6. The package as recited in claim 1 wherein said shell has a retention clip that engages and mechanically retains said lead frame in contact with said shell.

7. The package as recited in claim 1 wherein said lead frame and said shell are composed of plastic.

8. A method of manufacturing a surface mount package for containing a board-mounted power supply, comprising the steps of:
    forming a plurality of leads having first ends and second, surface mount ends;
    retaining, with a dielectric lead frame, said plurality of leads in predetermined positions relative to one another such that at least some of said second, surface mount ends are co-planar, said first ends couplable to said board-mounted power supply;
    coupling a shell to said lead frame, said shell forming a portion of a periphery of said surface mount package; and
    introducing potting material between said lead frame and said shell, said potting material adapted to resist movement of said board-mounted power supply within said surface-mount package.

9. The method as recited in claim 8 wherein said first ends are through-hole mount ends adapted to pass through corresponding vias in said board-mounted power supply.

10. The method as recited in claim 8 wherein said step of introducing comprises the step of introducing said potting material through a potting port in said lead frame.

11. The method as recited in claim 8 wherein said lead frame has a retention clip, said method further comprising the step of engaging and mechanically retaining a board-mounted power supply in contact with said first ends.

12. The method as recited in claim 8 wherein said board-mounted power supply has a magnetic core associated therewith, said method further comprising the step of placing a compliant material proximate said magnetic core, said compliant material adapted to absorb compressive forces generated in said potting material.

13. The method as recited in claim 8 wherein said shell has a retention clip, said step of coupling comprising the step of engaging and mechanically retaining said lead frame in contact with said shell with said retention clip.

14. The method as recited in claim 8 wherein said lead frame and said shell are composed of plastic and wherein said lead frame comprises a removable pick-and-place bridge.

15. A surface mount packaged power supply, comprising:
   a plurality of leads having first ends and second, surface mount ends;
   a dielectric lead frame that retains said plurality of leads in predetermined positions relative to one another such that at least some of said second, surface mount ends are co-planar;
   a power supply having a magnetic core associated therewith and conductors coupled to at least some of said first ends;
   a shell, coupled to said lead frame, that forms a portion of a periphery of said surface mount package; and
   potting material, located between said lead frame and said shell and at least partially surrounding said power supply, that resists movement of said power supply within said surface-mount package.

16. The power supply as recited in claim 15 wherein said first ends are through-hole mount ends and wherein said power supply comprises a circuit board having corresponding vias therein, said through-hole mount ends adapted to pass through said vias.

17. The power supply as recited in claim 15 wherein said lead frame has a potting port that allows said potting material to be introduced between said lead frame and said shell.

18. The power supply as recited in claim 15 wherein said lead frame has a retention clip that engages and mechanically retains said board-mounted power supply in contact with said first ends.

19. The power supply as recited in claim 15 further comprising a compliant material, proximate said magnetic core, that absorbs compressive forces generated in said potting material.

20. The power supply as recited in claim 15 wherein said shell has a retention clip that engages and mechanically retains said lead frame in contact with said shell.

21. The power supply as recited in claim 15 wherein said lead frame and said shell are composed of plastic.

* * * * *

UNITED STATES PATENT AND TRADEMARK OFFICE
CERTIFICATE OF CORRECTION

PATENT NO. : 5,959,842
DATED : September 28, 1999
INVENTOR(S) : Scott E. Leonard, et al.

It is certified that error appears in the above-identified patent and that said Letters Patent is hereby corrected as shown below:

On the title page: Item [75]

add --Raymond W. Pilukaitis, Garland, Texas-- as an inventor.

Signed and Sealed this

Twenty-ninth Day of February, 2000

Attest:

Q. TODD DICKINSON

Attesting Officer

Commissioner of Patents and Trademarks